Dec. 23, 1958 N. F. SCHUH 2,866,106
VOLTAGE SENSITIVE CONTROL DEVICE
Filed June 22, 1956
Fig. I.
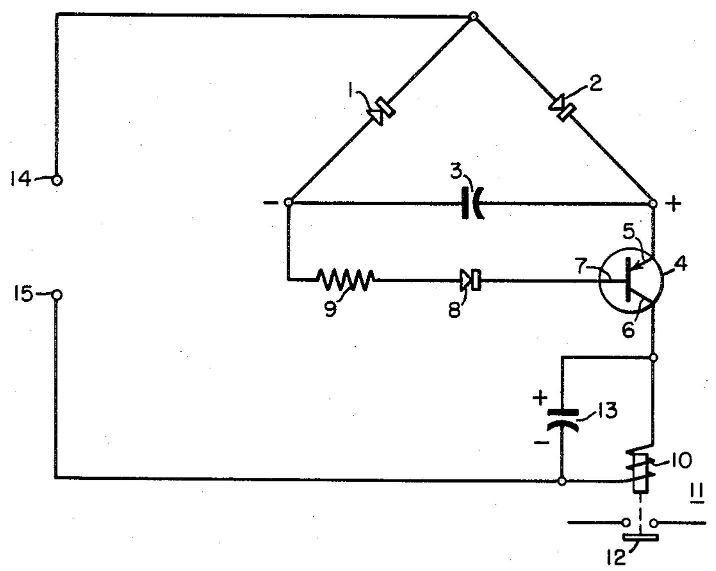
Fig. 2.
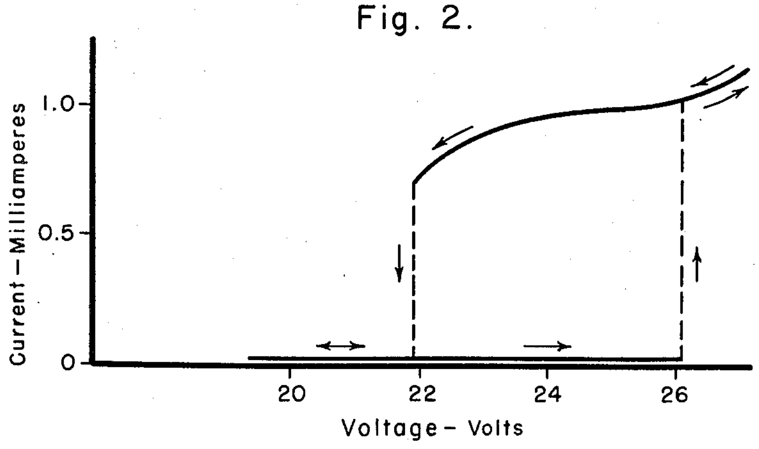
WITNESSES
Robert C. Baird
Leon J. Jaza
INVENTOR
Niles F. Schuh
BY F. P. Lyle
ATTORNEY 2,866,106

VOLTAGE SENSITIVE CONTROL DEVICE

Niles F. Schuh, Lima, Ohio, assignor to Westinghouse Electric Corporation, East Pittsburgh, Pa., a corporation of Pennsylvania Application June 22, 1956, Serial No. 593,254

4 Claims. (Cl. 307—88.5)

The present invention relates to a voltage sensitive control device and, more particularly, to a voltage sensitive circuit having bistable operation.

For many control purposes, it is necessary or desirable to utilize a device having bistable characteristics, that is, a device or circuit having two stable conditions of operation, so that a triggering action can be obtained to energize a load device, such as a relay. Various types of triggering devices have been used, such as arc discharge tubes and magnetic amplifier circuits with positive feedback, for example, but all the known devices have disadvantages which make them undesirable for certain applications such as in aircraft electrical systems where small size and high reliability are essential.

The principal object of the present invention is to provide a voltage sensitive circuit having bistable operation and consisting of rugged, static devices of small size and high reliability.

A further object of the invention is to provide a voltage sensitive circuit or control device consisting of semiconductor devices and other static components, and which has bistable operation and a relatively slow response, so that time delay operation is obtainable, which is frequently desirable.

Other objects and advantages of the invention will be apparent from the following detailed description, taken in connection with the accompanying drawing, in which:

Figure 1 is a schematic diagram showing an illustrative embodiment of the invention; and Fig. 2 is a curve illustrating the operation of the circuit of Fig. 1.

The voltage sensitive circuit shown in Fig. 1 includes two rectifier cells or diodes 1 and 2, which may be any suitable type of rectifier, preferably semiconductor diodes, and which are connected together in series as shown. A capacitor 3 is connected across the two rectifiers 1 and 2. A transistor 4 having an emitter electrode 5, a collector electrode 6, and a base electrode 7 is also provided. The emitter 5 and base 7 of the transistor 4 are connected across the capacitor 3, with a semiconductor diode 8 and a resistor 9 in series with the base 7.

The diode 8 is a semiconductor diode, such as a silicon diode, having a predetermined reverse breakdown voltage. It will be understood that semiconductor diodes, such as silicon diodes, have a sharp reverse breakdown voltage, often called the Zener voltage, which can be made to have any desired value within a wide range. At voltages below this value, the device is a rectifier and only a negligibly small leakage current can flow in the reverse direction. When the reverse voltage is increased above the breakdown value, however, the diode becomes a very low resistance and permits current to flow freely in the reverse direction with no substantial increase in voltage. When the voltage again falls below the breakdown or Zener value, the diode regains its rectifying characteristics and reduces the reverse current to a negligible leakage value. The diode 8 is a semiconductor diode having these characteristics with a predetermined breakdown voltage which determines the operating voltage of the circuit, as described hereinafter.

The collector 6 of the transistor is connected in series with a load device, shown as the operating coil 10 of a relay 11 having contacts 12. A capacitor 13 is connected across the coil 10. The voltage to which the circuit is to respond is applied to terminals 14 and 15, which are connected, respectively, to the junction between the rectifiers 1 and 2, and to the coil 10, so that the voltage is applied across the load device 10 and the collector and emitter of the transistor 4 through the rectifier 2. It will be understood that, although a relay coil has been shown for the purpose of illustration, the load device 10 may be any desired type of device which is to be actuated or energized in response to the voltage applied to the terminals 14 and 15.

The operation of this circuit when a voltage is applied to the terminals 14 and 15 is illustrated in Fig. 2, in which the current in the load device 10 is plotted against the applied voltage. It will be seen that when the voltage rises to a definite value, the load current increases from a negligibly small value to a relatively high value, with no further increase in voltage, energizing the relay 11 to actuate its contacts 12; when the voltage decreases to some lower value, the current falls to its previous negligible value, as indicated by the arrows on the figure. Thus, the circuit exhibits true bistable operation, since it has two stable conditions of operation, with a switching or triggering action as the voltage increases and a hysteresis effect when the voltage is decreased.

The operation of this circuit may be explained as follows. When an alternating current voltage is applied to the terminals 14 and 15, the rectifiers 1 and 2 keep the voltage across the capacitor 3 and diode 8 always positive in the direction indicated in Fig. 1. The diode 8 is connected, as shown, in the normally non-conducting direction, and when the applied voltage is such that the voltage across the diode 8 is below its breakdown voltage, no base current can flow to the transistor 4, so that it is non-conducting and only an extremely small leakage current can flow in the load device 10. If the applied voltage is increased to a value such that the voltage across the diode 8 exceeds its breakdown voltage, current can flow in the reverse direction through the diode 8 and the base circuit of the transistor 4, making the transistor conductive so that current can flow between the emitter and the collector.

During a positive half-cycle of the applied voltage, current flows through the rectifier 2, from the emitter 5 to the collector 6 of the transistor, and through the load device 10. The capacitor 13 is thus charged, with the polarity indicated on the drawing, by the voltage across the load device 10. During the following negative half-cycle of the applied voltage, current flows through the capacitor 13, the collector 6, and emitter 5, and through the capacitor 3 and the rectifier 1. The voltage of the capacitor 13 is in the direction to aid this current flow, and the capacitor 13 also tends to maintain the flow of current through the load device 10 in the same direction as in the positive half-cycle. Since the voltage of the capacitor 13 is thus added to the applied voltage, the capacitor 3 is charged to a voltage which is higher than the peak value of the applied voltage. The base circuit of the transistor 4 is connected across the capacitor 3, and this increase in the voltage of the capacitor 3 causes an increase in the transistor base current, which permits a larger emitter-to-collector current. Therefore, on the following positive half-cycle of the applied voltage, an increased current flows through the rectifier 2, the emitter and collector of the transistor and the load 10, thus charging the capacitor 13 to a higher voltage than before. This increase in the voltage of the capacitor 13 charges the capacitor 3 to a still higher voltage in the next negative half-cycle, which again increases the transistor base current and the emitter-to-collector current.

Thus, on successive half-cycles of the applied voltage, the capacitor 3 is charged to higher and higher voltages, resulting in successive increases in the load current. This self-perpetuating series of increases in current and voltage continues rapidly, with no increase in the applied voltage, until the current is limited by the resistance of the circuit. Thus, a triggering or switching action is obtained, since as soon as the applied voltage exceeds the predetermined value corresponding to the breakdown voltage of the diode 8, the load current increases to a maximum value which is very much higher than the negligibly small load current at lower voltages, as illustrated in Fig. 2.

When the applied voltage is decreased, the current does not fall to its initial value until the voltage has reached some lower value than that required to trigger the circuit. The applied voltage may be decreased substantially below the value required to trigger the circuit, because the capacitor 3 is charged to a voltage higher than the applied voltage, as explained above, so that the applied voltage can be substantially decreased before the voltage across the diode 8 falls below its breakdown value. As the applied voltage is decreased, however, the base current of the transistor 4 is reduced, so that less current flows between the emitter and collector, and the capacitor 13 is not charged to as high a value as before on the positive half-cycles. Thus, the voltage of the capacitor 3 decreases on successive half-cycles, as the voltage of the capacitor 13 decreases, and as a result, the voltage across the diode 8 rapidly falls below its breakdown value, cutting off the base current to the transistor 4 so that the transistor again becomes nonconducting and the load current drops to its initial negligible value. Fig. 2 illustrates this operation of the circuit, and shows true bistable operation, that is, a triggering action at a predetermined voltage and a hysteresis effect in returning to the off condition.

It has been found that the action of this circuit is very effective and that a large increase in current at the predetermined voltage can be obtained. Thus, for example, the values shown in Fig. 2 were obtained with a circuit in which the resistor 9 had a value of 5,000 ohms, the load device 10 had a resistance of 22,000 ohms, and the capacitors 3 and 13 each had a capacitance of 0.6 microfarad. With these circuit constants, the load current increased from approximately 0.03 milliampere to 1.0 milliamperes at a triggering voltage slightly over 26 volts. The voltage at which the triggering action occurs is, of course, determined by the breakdown or Zener voltage of the diode 8 and can be made to have any desired value. The width of the hysteresis loop can readily be changed by adjusting the value of the resistor 9, an increase in the resistance reducing the width of the hysteresis loop.

This circuit has a further characteristic which is of considerable advantage in many applications. The response to change in voltage is relatively slow because of the building up of the currents and voltages on successive half-cycles, as explained above. Thus, with the illustrative circuit constants mentioned above, at a frequency of 400 cycles per second, a time of approximately $1/10$ of a second was required for the current to reach 63% of its final value after the voltage reached the triggering value. This time could be increased by increasing the capacitance of either or both of the capacitors 3 and 13, and might be decreased by reducing the values of capacitance but with less distinct bistable operation. An increase in the resistance of the resistor 9 also tends to increase the switching time. This relatively slow response is a considerable advantage in many applications, such as in overvoltage protection, for example, where operation on transients of brief duration is not desired. The switching time also depends on the magnitude of the applied voltage, so that an inverse time voltage characteristic can be obtained.

It will now be apparent that a voltage sensitive circuit has been provided which has many advantages as a control device, since it consists only of rugged, static components of small size and high reliability and has a very desirable bistable operating characteristic. The current in the load device is essentially unidirectional so that a small, rugged, direct current relay can be used. It is to be understood that the particular circuit constants mentioned above are only illustrative, and that these values are not critical but may be varied over a wide range to obtain the desired operating characteristics for a particular application. It will also be understood that although a preferred embodiment of the invention has been shown for the purpose of illustration, various modifications and other embodiments are possible within the scope of the invention. Thus, for example, a relay 11 has been shown as the load device to be actuated by the circuit, but it will be obvious that any other desired type of load device might be utilized, including static devices such as a power transistor. The transistor 4 has been shown as being of the PNP type, but a transistor of the NPN type could obviously be used equally well, with an appropriate change in the polarities. Similarly, other modifications and embodiments will be apparent to those skilled in the art, and are within the scope of the invention.

I claim as my invention:

1. A voltage sensitive circuit comprising a transistor having base, collector and emitter electrodes, a load device connected in series with said collector and emitter electrodes, means for applying an alternating voltage across said series-connected load device and collector and emitter electrodes, a first capacitor connected to be charged unidirectionally by said voltage, the base and emitter electrodes of the transistor being connected across said first capacitor, voltage responsive means for preventing current flow to the base electrode when said voltage is below a predetermined value, and a second capacitor connected across said load device.

2. A voltage sensitive circuit comprising a transistor having base, collector and emitter electrodes, a load device connected in series with said collector and emitter electrodes, means for applying an alternating voltage across said series-connected load device and collector and emitter electrodes, a first capacitor connected to be charged unidirectionally by said voltage, the base and emitter electrodes of the transistor being connected across said first capacitor, a semiconductor diode connected in series with the base electrode in a direction to prevent current flow when said voltage is below a predetermined value, and a second capacitor connected across said load device.

3. A voltage sensitive circuit comprising two rectifier devices connected in series, a first capacitor connected across said rectifier devices, a transistor having base, collector and emitter electrodes, the base and emitter electrodes being connected across said first capacitor, voltage responsive means for preventing current flow to the base electrode when a voltage less than a predetermined value is applied to the voltage responsive means, a load device connected to said collector electrode, a second capacitor connected across the load device, and means for applying an alternating voltage across the load device and one of said rectifier devices.

4. A voltage sensitive circuit comprising two rectifier devices connected in series, a first capacitor connected across said rectifier devices, a transistor having base, collector and emitter electrodes, the base and emitter electrodes being connected across said first capacitor, a semiconductor diode connected in series with the base electrode in a direction to prevent current flow when the voltage across the diode is below a predetermined value, a resistor connected in series with said diode, a load device connected to said collector electrode, a second capacitor connected across the load device, and means for applying an alternating voltage across the load device and one of said rectifier devices.

References Cited in the file of this patent

UNITED STATES PATENTS 2,281,040 Kalb ---------------- Apr. 28, 1942
2,681,996 Wallace ---------------- June 22, 1954

FOREIGN PATENTS 1,110,097 France ---------------- Oct. 5, 1955